United States Patent [19]

Hoang

[11] Patent Number: 5,573,600
[45] Date of Patent: Nov. 12, 1996

[54] SOLAR POWER SYSTEM

[76] Inventor: Shao-Kuang Hoang, No. 29, 36th Rd., Kung Yeh Dist., Taichung, Taiwan

[21] Appl. No.: 417,247
[22] Filed: Apr. 5, 1995
[51] Int. Cl.$^6$ .......................... H01L 31/058; E04D 13/18
[52] U.S. Cl. .......................... 136/248; 126/622; 136/251; 136/291
[58] Field of Search .................................. 136/248, 251, 136/291; 52/173.3; 126/622

[56] References Cited

U.S. PATENT DOCUMENTS

| 4,946,512 | 8/1990 | Fukoroi et al. | 136/248 |
| 5,367,843 | 11/1994 | Hirai et al. | 52/200 |
| 5,406,936 | 4/1995 | Hirai et al. | 52/173.3 |

Primary Examiner—Aaron Weisstuch
Attorney, Agent, or Firm—Charles E. Baxley, Esq.

[57] ABSTRACT

A solar power system including a thermal-storage tank installed in the ridge of the roof of a building, and a plurality of solar collector units covered over the roof and outside wall of the building and connected to the thermal-storage tank, wherein each solar collector unit comprises a transparent cover plate with photovoltaic cells for converting the radiant energy of sunlight into electric power, a rear mounting rail, a front mounting frame for engagement with the rear mounting rail of another solar collector unit, a heat-absorber plate having a collector tube connected to the thermal-storage tank, and a lateral mounting frame for connection to another solar collector unit over its heat-absorber plate by screws.

5 Claims, 12 Drawing Sheets

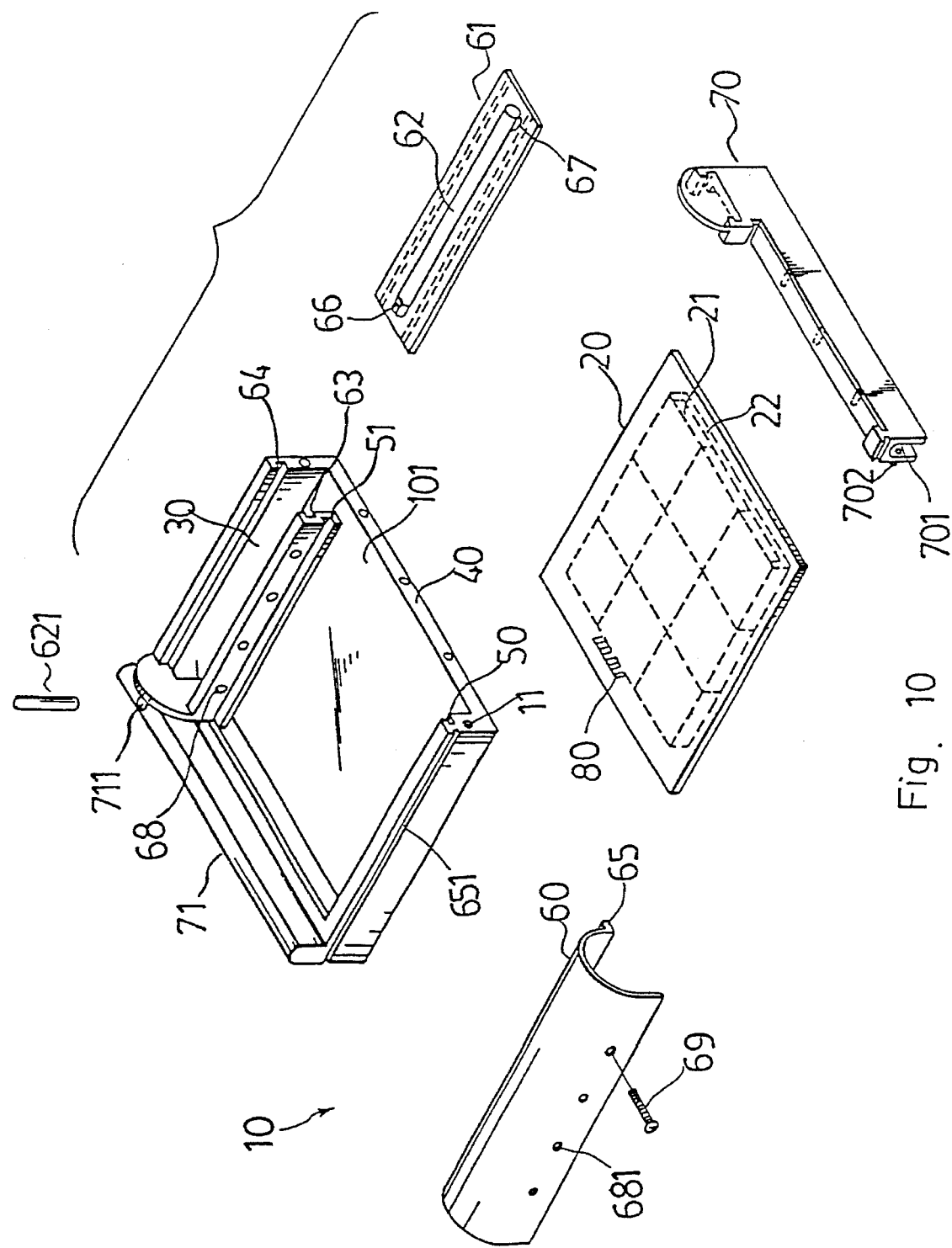

SOLAR POWER SYSTEM

BACKGROUND OF THE INVENTION

The present invention relates to a solar power system which comprises a thermal-storage tank installed in the ridge of the roof of a building, and a plurality of solar collector units connected to the thermal-storage tank and covered over the roof and outside wall of the building.

Various solar power systems have been developed for collecting the heat energy of the sun or converting the radiant energy of sunlight into electric power. FIGS. 1, 2, 3, and 4 show a roof-mounting type solar power system according to the prior art which comprises a collapsible mounting frame for mounting on the roof of a building, a flat-plate solar collector unit, and a thermal-storage tank. FIGS. 7, 8, and 9 show another structure of a solar power system which comprises a mounting frame for mounting on the roof of a building, a solar collector panel, and a piping system. Furthermore, roof tiles or corrugated sheets may be used and installed to cover and decorate the roof and outside wall of a building (see FIGS. 5 and 6). When a solar power system is installed in the roof or outside wall of a building, the sense of beauty of the roof or outside wall will be obstructed and, the waterproof layer of the roof will be damaged and must be repaired or reinforced. After the installation of a solar power system, the angular position of the solar collector panel must be frequently changed to effectively collect the radiant energy of sunlight because the solar collector panel can only be mounted within a limited area on the roof of the building.

SUMMARY OF THE INVENTION

According to one aspect of the present invention, the solar power system comprises a plurality of solar collector units respectively shaped like a tile and covered over the roof and outside wall of a building, and a thermal-storage tank installed in the ridge of the roof frame to collect the heat energy of the sun transmitted from the solar collector units.

According to another aspect of the present invention, each solar collector unit comprises a transparent cover plate with photovoltaic cells for converting the radiant energy of sunlight into electric power, a rear mounting rail, a front mounting frame for engagement with the rear mounting rail of another solar collector unit, a heat-absorber plate having a collector tube connected to the thermal-storage tank, and a lateral mounting frame for connection to another solar collector unit over its heat-absorber plate by screws.

BRIEF DESCRIPTION OF THE DRAWINGS

FIG. 10 is an exploded view of a solar collector unit according to the present invention;

DETAILED DESCRIPTION OF THE PREFERRED EMBODIMENT

Figure 1:
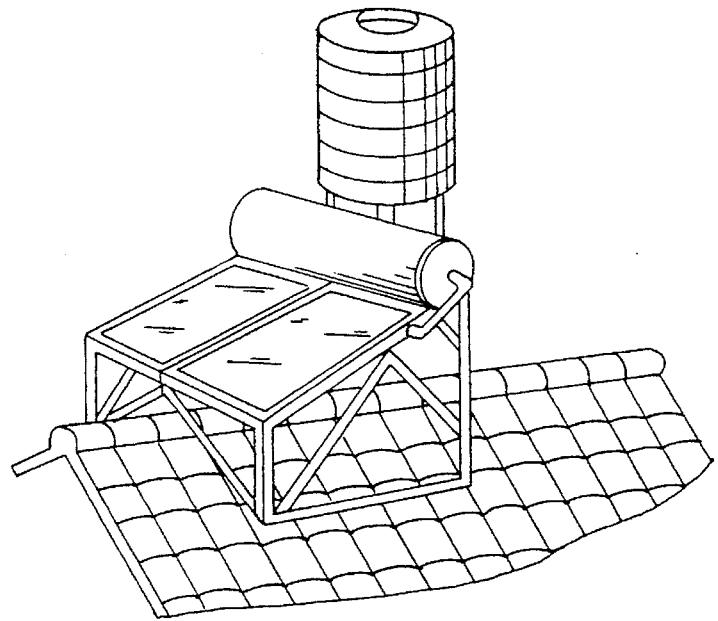
FIG. 1 is an view of a solar power system according to the prior art.
Figure 2:
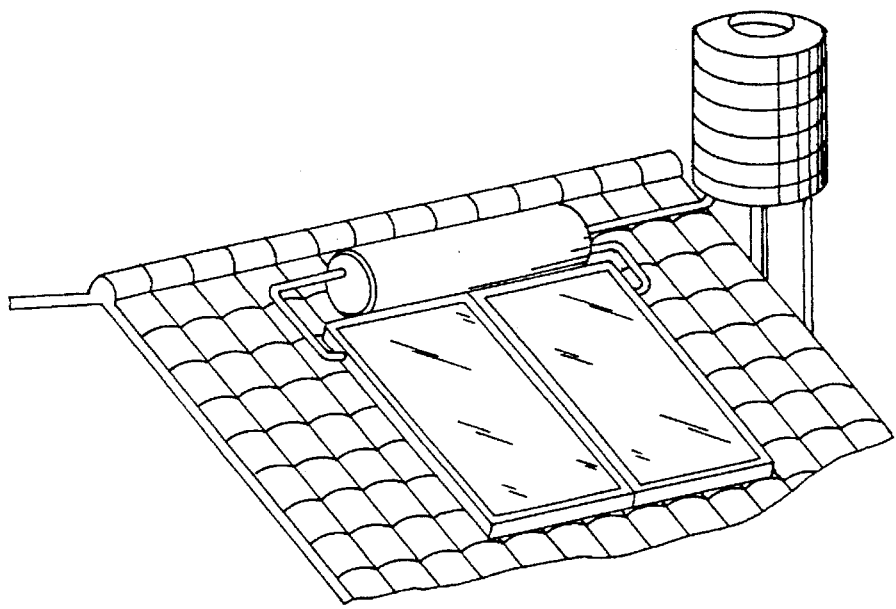
FIG. 2 shows an alternate arrangement of the solar power system of FIG. 1.
Figure 3:
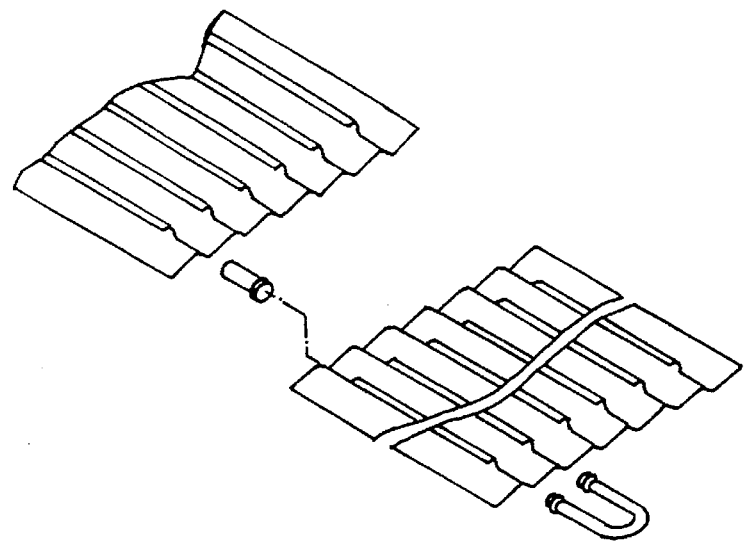
FIG. 3 is an exploded view of a part of the solar collector unit for the solar power system shown in FIG. 1.
Figure 4:
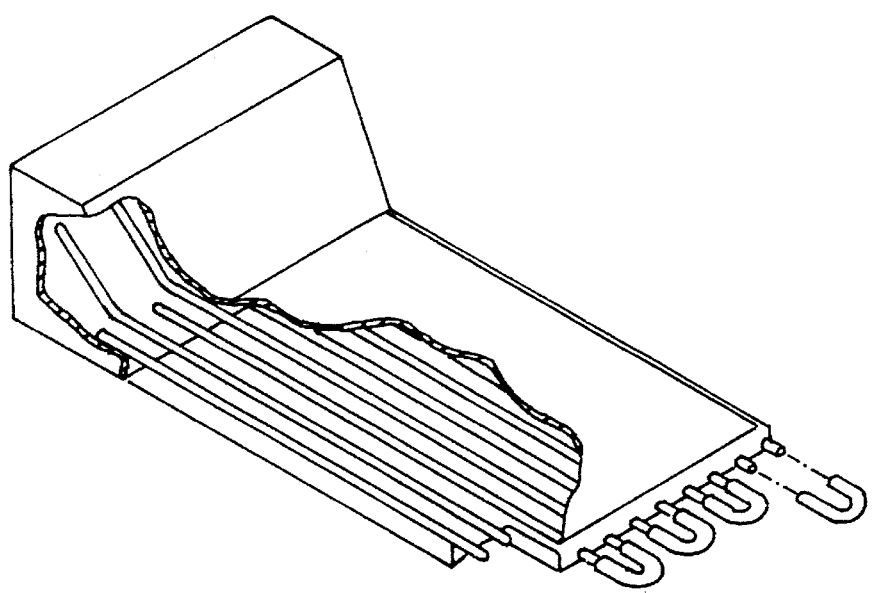
FIG. 4 shows an alternate form of the solar collector panel for the solar power system shown in FIG. 1.
Figure 5:
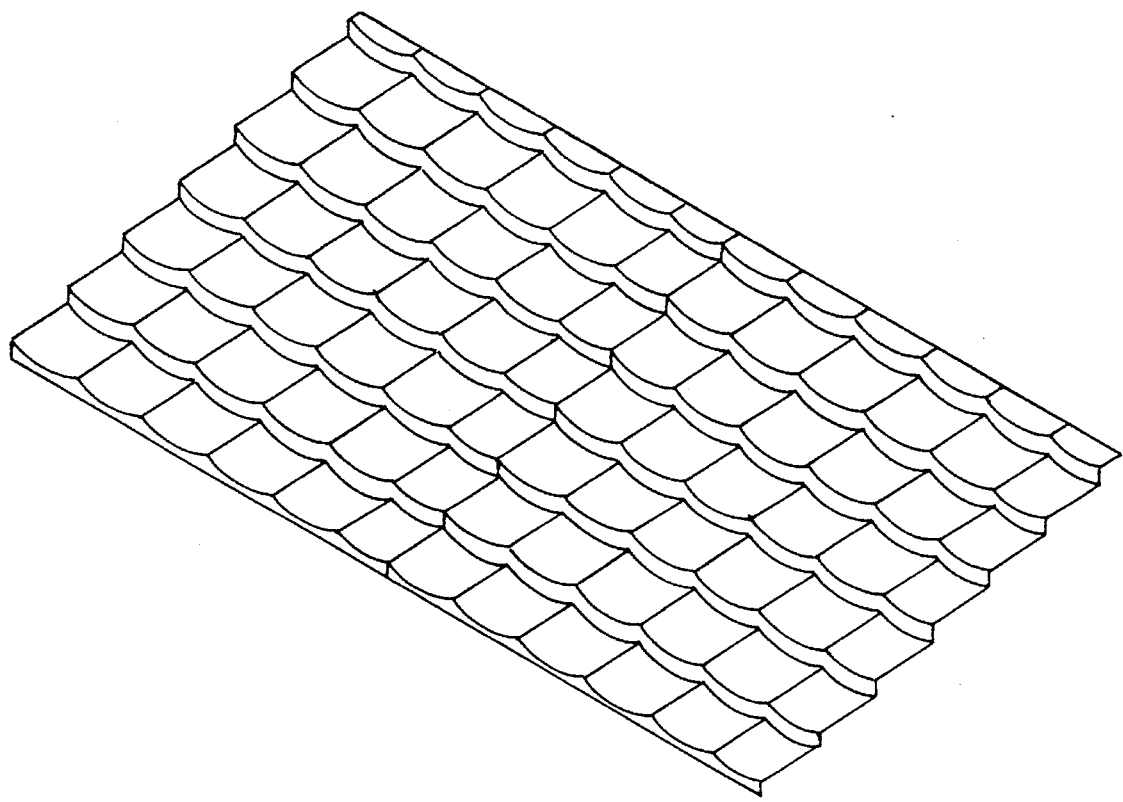
FIG. 5 shows the roof of a building covered by roof tiles.
Figure 6:
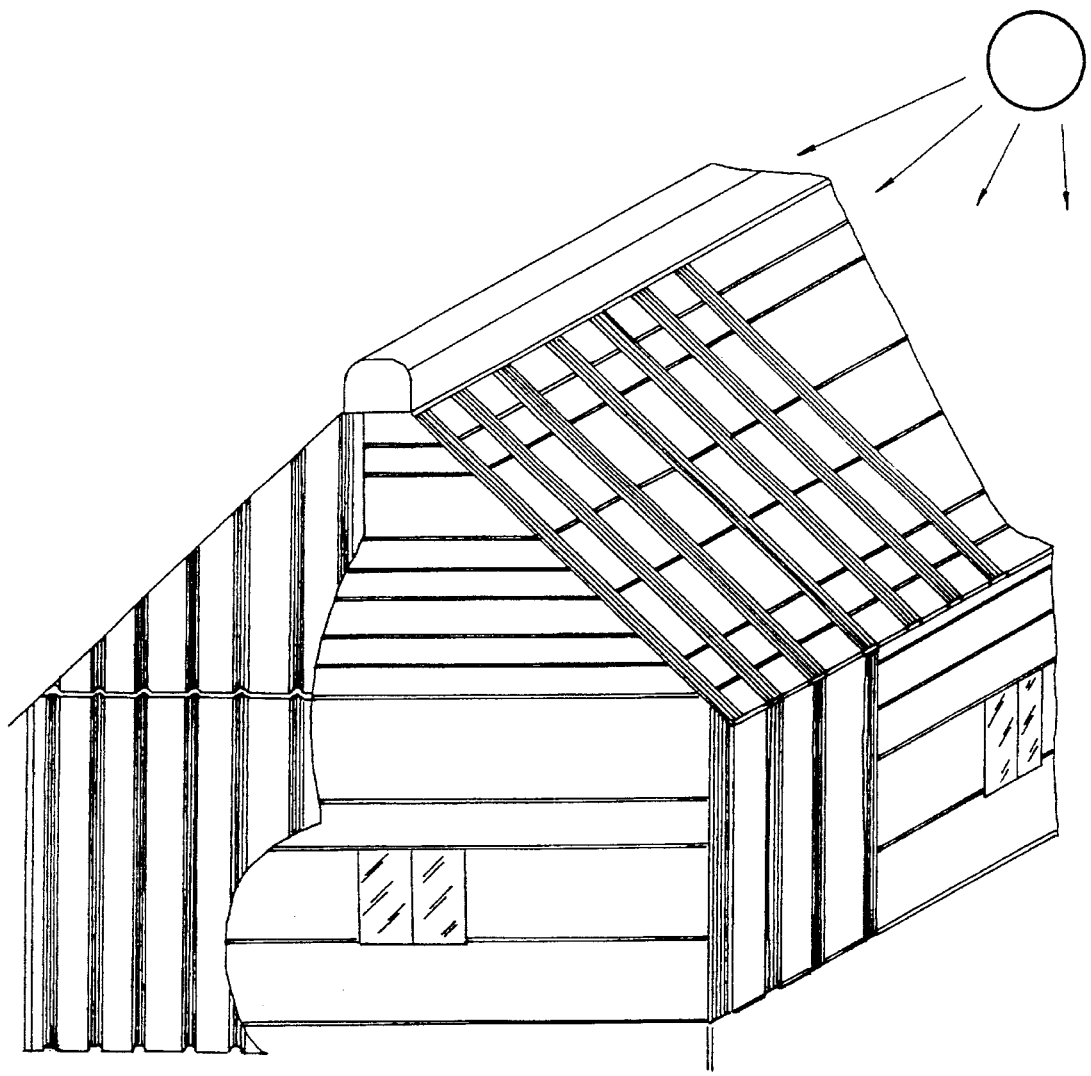
FIG. 6 shows the roof and outside wall of a building covered by corrugated sheets.
Figure 7:
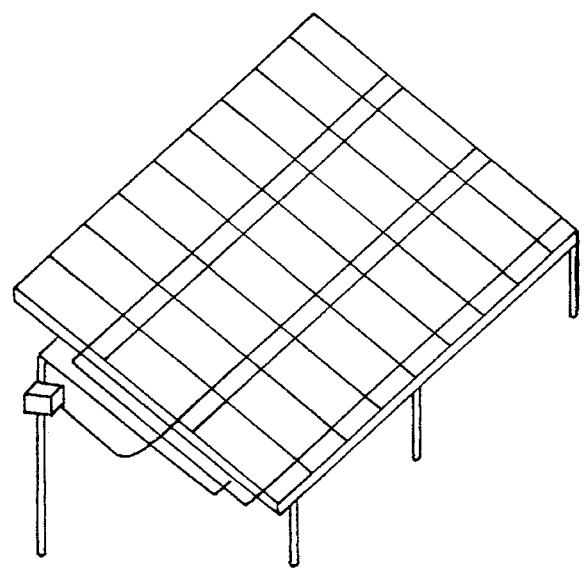
FIG. 7 shows another solar power system according to the prior art.
Figure 8:
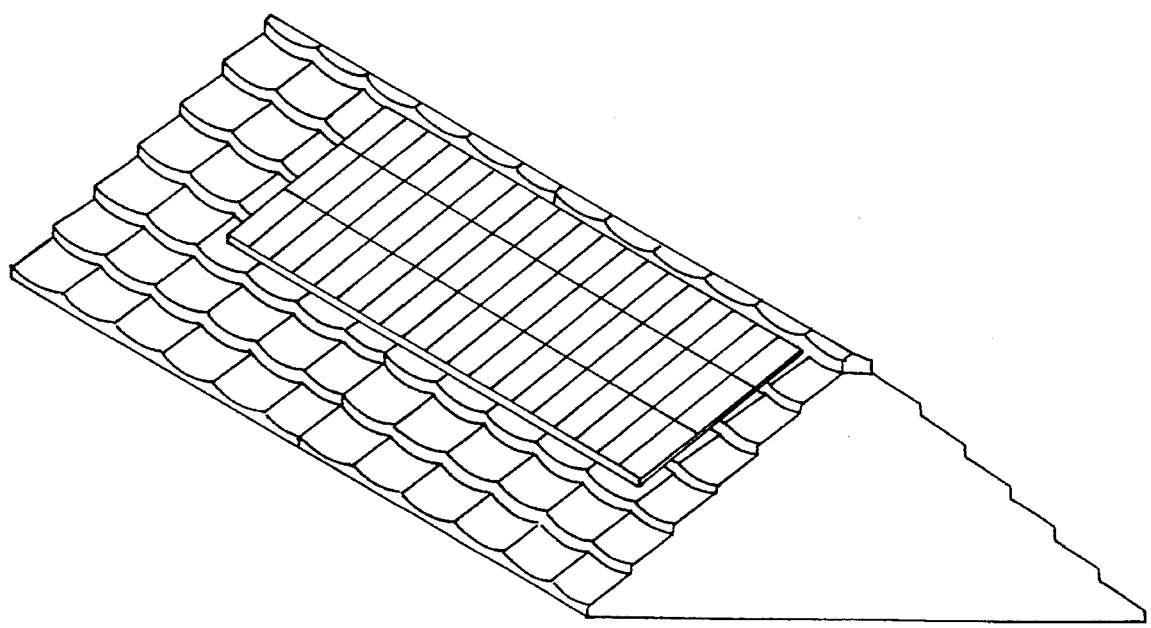
FIG. 8 shows the solar power system of FIG. 7 installed in the roof of a building.
Figure 9:
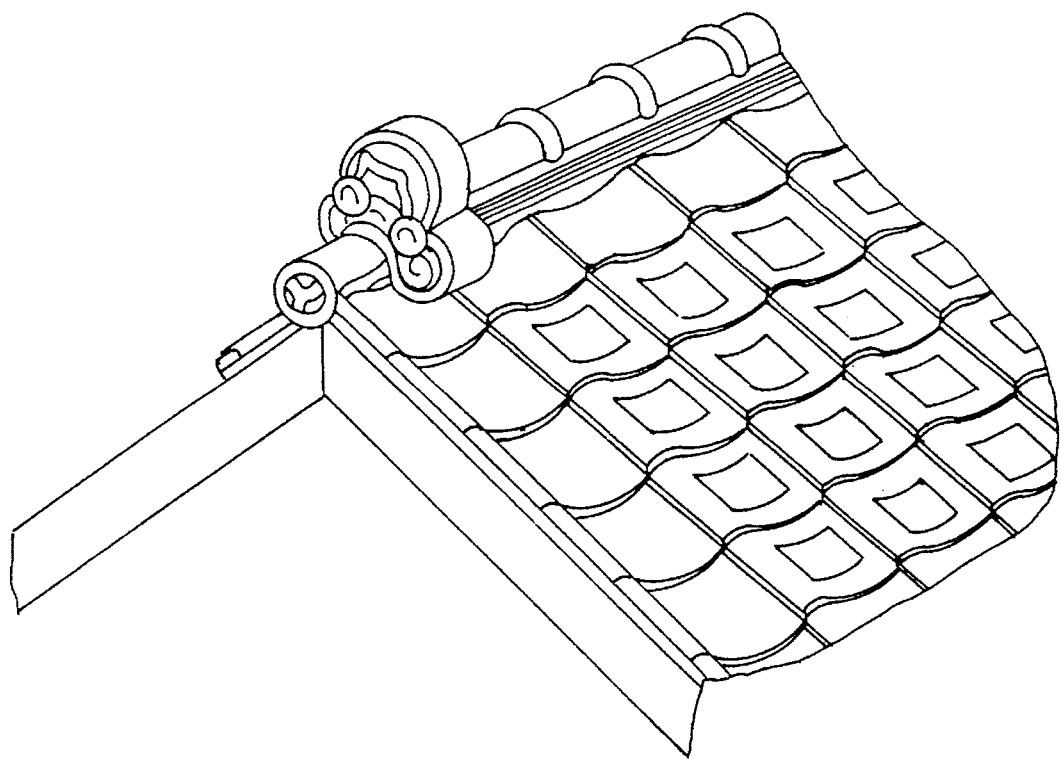
FIG. 9 is a cutaway of the roof of the building shown in FIG. 8.
Figure 10A:
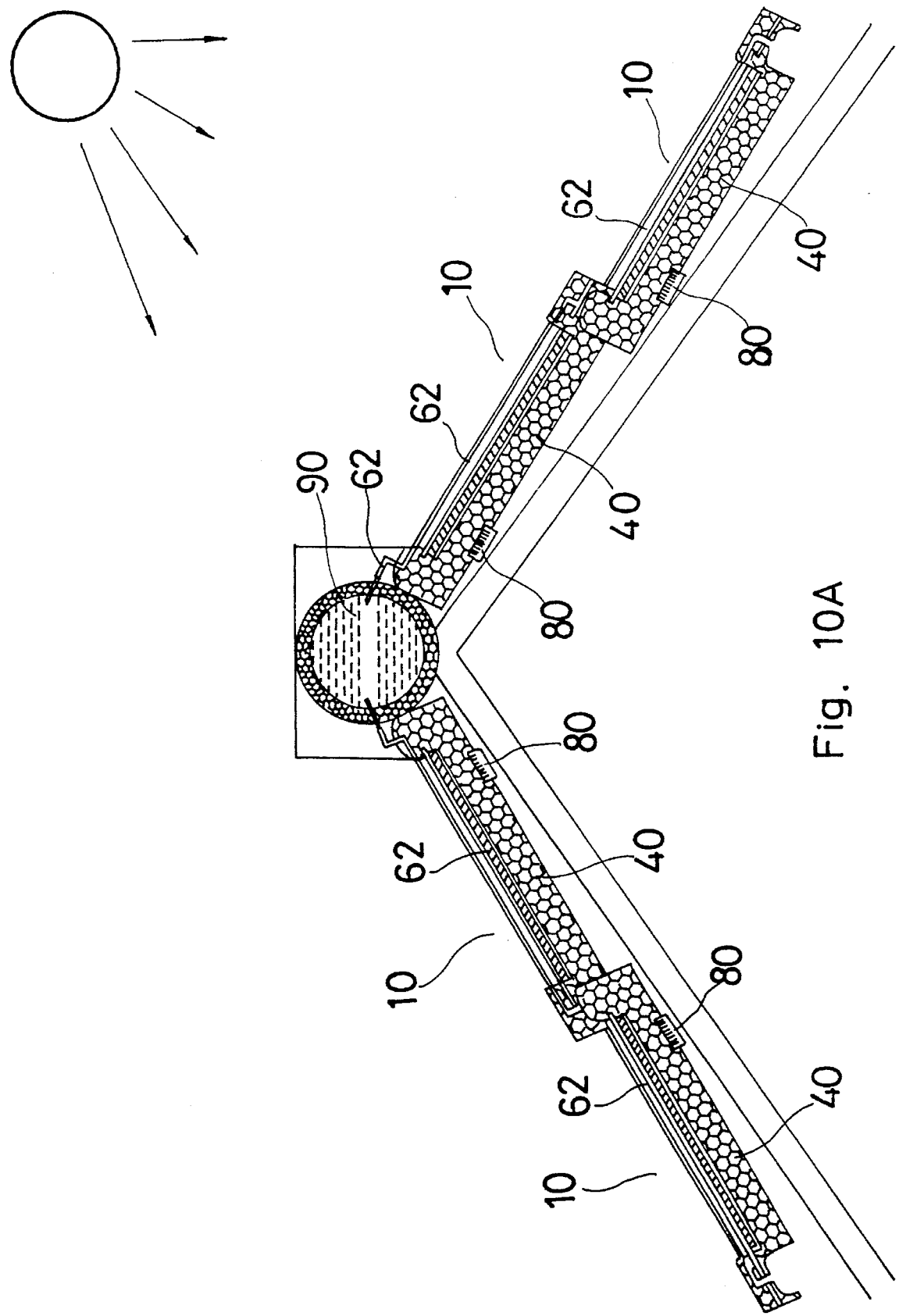
FIG. 10A is a sectional view showing the installation of a solar power system in the roof of a building.
Figure 11:
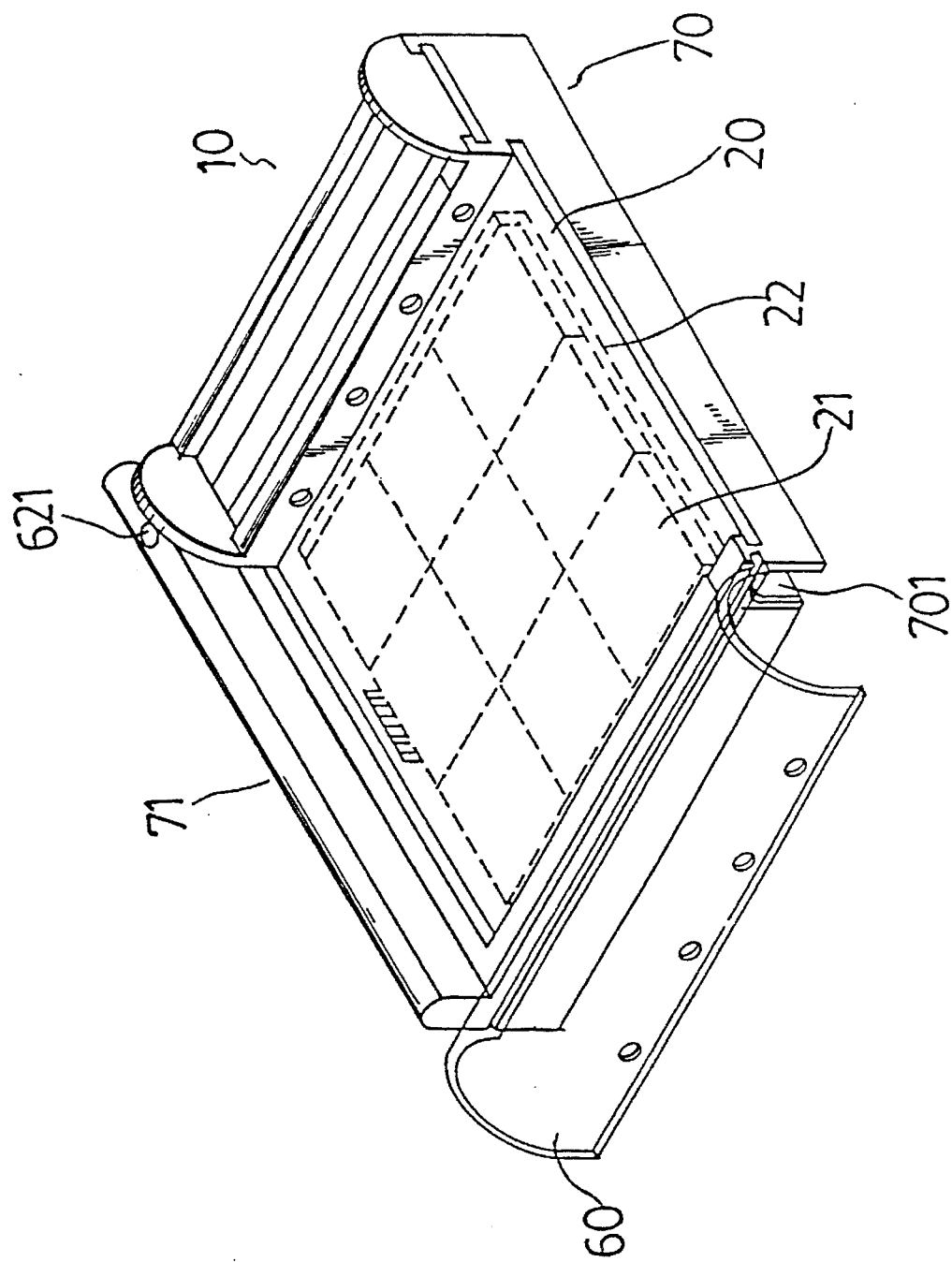
FIG. 11 is a perspective view of the solar collector unit shown in FIG. 10.
Figure 12:
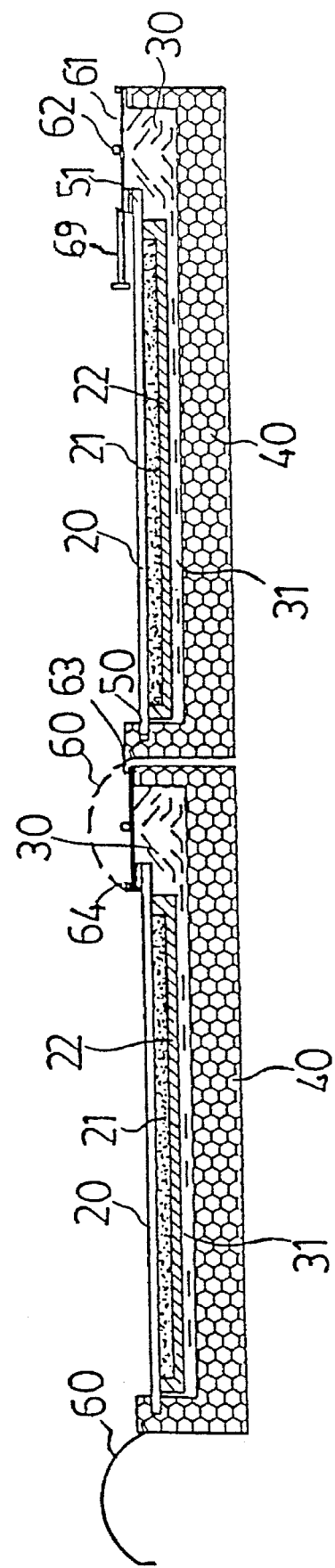
FIG. 12 is a sectional view showing two solar collector units connected transversely according to the present invention.
Figure 13:
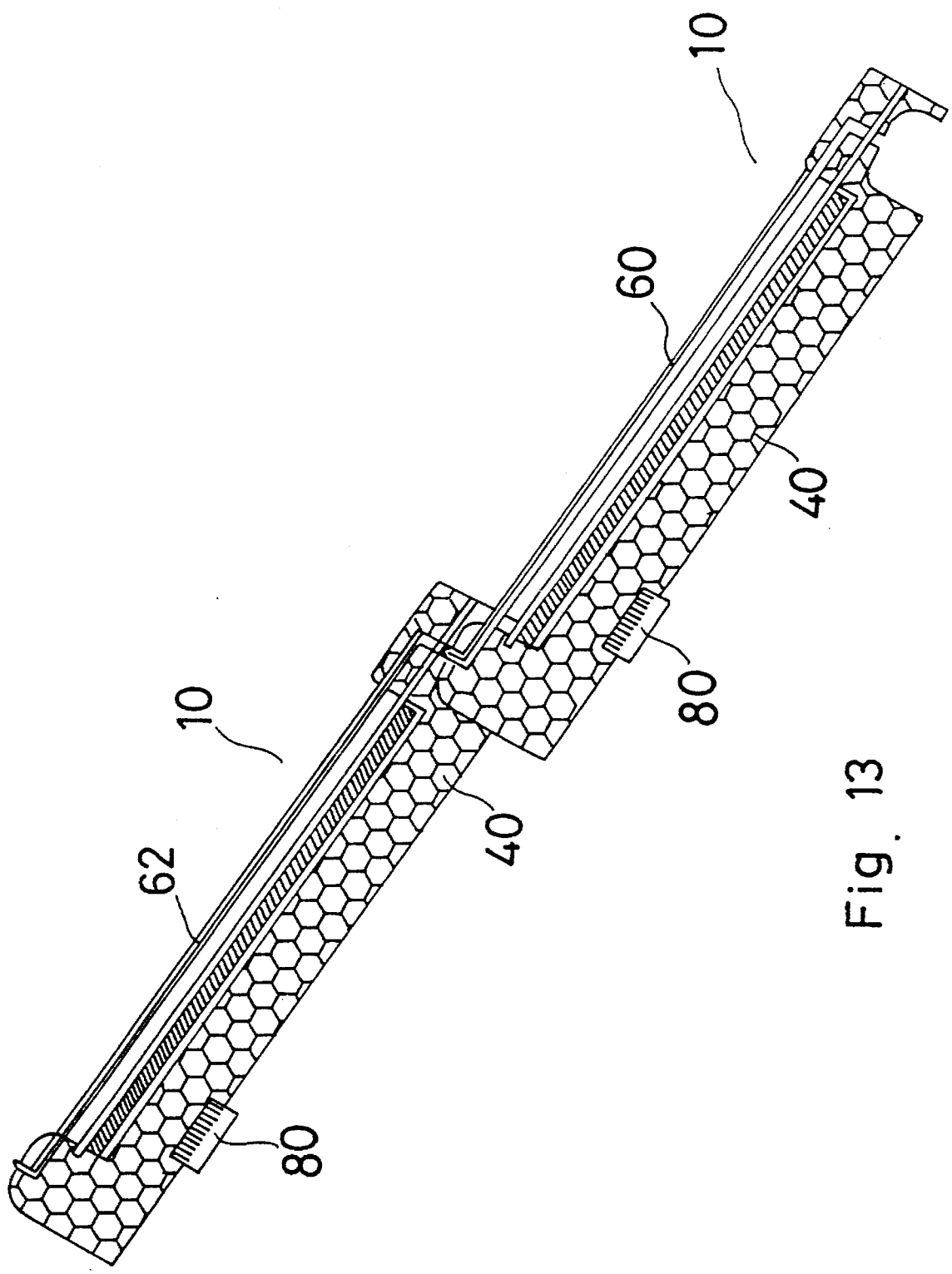
FIG. 13 is a sectional view showing two solar collector units connected longitudinally according to the present invention.
Figure 14:
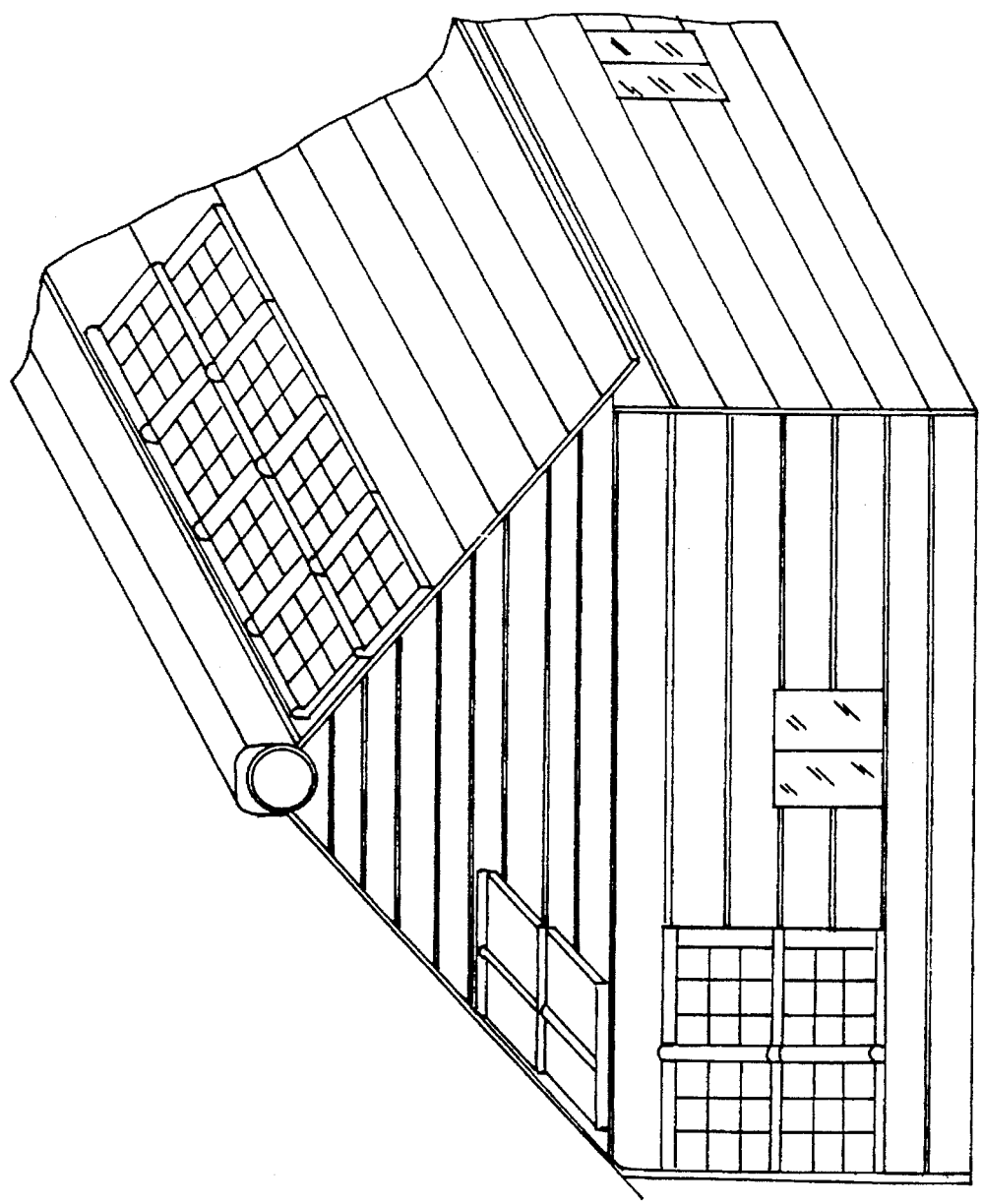
FIG. 14 is another installed view of the present invention, showing the solar collector units covered over the roof and outside wall of the building.

Referring to FIGS. 10 and 11, a solar collector unit, referenced by 10, comprises a heat-insulative base frame 40 covered with a layer made from foamed plastics shaped like a tile for roofing, a transparent, channel-like lateral mounting frame 60, a heat-absorber plate 61, a transparent protective cover plate 20, and a channel-like front mounting frame 70. The heat-insulative base frame 40 comprises a top receiving chamber 101 having two opposite side grooves 50 and 51 bilaterally disposed on the inside, a top convection chamber 30 disposed at one side by the top receiving chamber 101 and having two opposite side grooves 63 and 64 bilaterally disposed on the inside, a series of screw holes 68 inside the top receiving chamber 101 above one side groove 51, an outer mounting groove 651 at one lateral side thereof adjacent to the top receiving chamber 101, a plurality of front pin holes 11 on the front side thereof, a top mounting rail 71 raised from the rear side thereof, and a rear pin hole 711 on the top mounting rail 71 in communication with the top convection chamber 30. The channel-like lateral mounting frame 60 has an outward flange 65 longitudinally disposed at one lateral side and fitted into the outer mounting groove 651 on the base frame 40, and a series of mounting holes 681 longitudinally aligned at an opposite lateral side. The channel-like front mounting frame 70 comprises a plurality of upright pins 702 at the back side respectively fitted into the front pin holes 11 on the base frame 40, defining a bottom mounting groove 701 of size matching the top mounting rail 71. The transparent protective cover plate 20 is inserted into the side grooves 50 and 51 and covered over the top receiving chamber 101, having an electric energy output interface board 80 at the back side, a plurality of photovoltaic cells 21 abutted one against another at the same elevation and connected to the electric energy output interface board 80 for converting the radiant energy of sunlight into electric energy, an insulative bottom layer 22 covered over the photovoltaic cells 21 at the bottom side. When the transparent protective cover plate 20 made of toughened glass or polycarbonate covered with an insulative bottom layer is installed, an air chamber 31 (see FIG. 12) is defined between the base frame 40 and the transparent protective cover plate 20 and communicated with the top convection chamber 30. The heat-absorber plate 61 is inserted into the side grooves 63 and 64 and covered over the top convection chamber 30 before the installation of the front mounting frame 70, having a collector tube 62, a rear mounting hole 66 and a front mounting hole 67. When the heat-absorber plate 61 is inserted into the side grooves 63 and 64, a pin 621 is fitted into the rear mounting hole 66 on the heat-absorber plate 61 and the rear pin hole 711 on the top mounting rail 71 to secure the heat-absorber plate 61 to the base frame 40. After the front mounting frame 70 is fastened to the base frame 40 by fitting the pins 702 into the front pin holes 11, the front mounting frame 70 is secured to the heat-absorber plate 61 by fastening the front mounting hole 67 to a respective mounting hole (not shown) on the front mounting frame 70 by a fastening element (not shown).

Referring to FIGS. 10A, 12, 13, and 14, a plurality of solar collector units 10 can be connected longitudinally and latitudinally and covered over the top of a building. By covering the lateral mounting frame 60 of one solar collector unit over the heat-absorber plate 61 of another and then threading a plurality of screws 69 through the mounting holes 681 on the lateral mounting frame 60 of one solar collector unit into the screw holes 68 on another solar collector unit, a plurality of solar collector units are connected in series transversely. By fitting the top mounting rail 71 of one solar collector unit into the bottom mounting groove 701 on the front mounting frame 70 of another solar collector unit, a plurality of solar collector units are connected in series longitudinally. Furthermore, a water reservoir 90 can be installed in the ridge of the roof of the building, which receives heat energy transmitted from the collector tube 62 of the heat-absorber plate 61 of each solar collector unit 10.

It is to be understood that the drawings are designed for purposes of illustration only, and are not intended as a definition of the limits and scope of the invention disclosed.

I claim:

1. A solar power system comprising a plurality of solar collector units connected one another and covered over the roof frame of a building, and a thermal-storage tank connected to said solar collector units to collect heat energy, wherein each solar collector unit comprises a heat-insulative base frame, a transparent, channel-like lateral mounting frame, a heat-absorber plate, a transparent protective cover plate, and a channel-like front mounting frame, said heat-insulative base frame comprising a top receiving chamber having two opposite side grooves bilaterally disposed on the inside, a top convection chamber disposed at one side by said top receiving chamber and having two opposite side grooves bilaterally disposed on the inside, a series of screw holes inside said top receiving chamber above one side groove, an outer mounting groove at one lateral side thereof adjacent to said top receiving chamber, a plurality of front pin holes on a front side thereof, and a top mounting rail raised from a rear side thereof, said channel-like lateral mounting frame having one lateral side fitted into said outer mounting groove on said base frame and an opposite lateral side made with a series of mounting holes for connection to the screw holes on another solar collector unit, said transparent protective cover plate being inserted into the side grooves on said top receiving chamber, comprising an insulative bottom layer, an electric energy output interface board, and a plurality of photovoltaic cells mounted above said insulative bottom layer and connected to said electric energy output interface board, said heat-absorber plate being inserted into the side grooves on said top convection chamber and having a collector tube connected to said thermal-storage tank, said channel-like front mounting frame having a plurality of upright pins at a back side thereof respectively fitted into said front pin holes on said base frame and a bottom mounting groove for engagement with the top mounting rail of another solar collector unit.

2. The solar power system of claim 1 wherein said transparent protective cover plate is made from toughened glass covered with an insulative bottom layer to hold a plurality of photovoltaic cells on the inside.

3. The solar power system of claim 1 wherein said transparent protective cover plate is made from polycarbonate covered with an insulative bottom layer to hold a plurality of photovoltaic cells on the inside.

4. The solar power system of claim 1 wherein said base frame is externally covered with an insulative layer made from foamed plastics.

5. The solar power system of claim 1 wherein said thermal-storage tank is installed in the ridge of the roof frame of the building.

* * * * *